United States Patent [19]

Diguet

[11] 3,852,129

[45] Dec. 3, 1974

[54] METHOD OF CARRYING OUT DIFFUSIONS WITH TWO SOURCES

[75] Inventor: Daniel Diguet, Herouville-St.-Clair, France

[73] Assignee: U.S. Philips Corporation, New York, N.Y.

[22] Filed: Mar. 29, 1973

[21] Appl. No.: 346,081

[30] Foreign Application Priority Data

Apr. 5, 1972 France .............................. 72.11912

[52] U.S. Cl. .................. 148/189, 148/186, 148/187, 252/62.3 GA, 117/201

[51] Int. Cl. .............................................. H01l 7/44

[58] Field of Search ........... 148/189, 190, 187, 186; 252/62.3 GA, 62.3 E; 117/201

[56] References Cited

UNITED STATES PATENTS

| | | | |
|---|---|---|---|
| 3,154,446 | 10/1964 | Jones | 148/189 |
| 3,305,412 | 2/1967 | Pizzarello | 148/189 |
| 3,377,216 | 4/1968 | Raithel | 148/189 |
| 3,540,952 | 11/1970 | Ehle | 148/189 |
| 3,617,820 | 11/1971 | Herzog | 148/186 X |
| 3,660,178 | 5/1972 | Takahashi et al. | 148/189 |

FOREIGN PATENTS OR APPLICATIONS

| | | | |
|---|---|---|---|
| 1,086,660 | 10/1967 | Great Britain | 148/189 |
| 1,054,360 | 1/1967 | Great Britain | 148/189 |

*Primary Examiner*—G. T. Ozaki
*Attorney, Agent, or Firm*—Frank R. Trifari

[57] ABSTRACT

The invention relates to a method of diffusing a doping material in a semiconductor body via the vapour phase. Two doping sources are used which differ in composition but have the same doping material. The diffusion operation consists of successive phases in which always one of the doping sources is used.

9 Claims, 2 Drawing Figures

PATENTED DEC 3 1974 3,852,129

METHOD OF CARRYING OUT DIFFUSIONS WITH TWO SOURCES

Figures 1, 2:
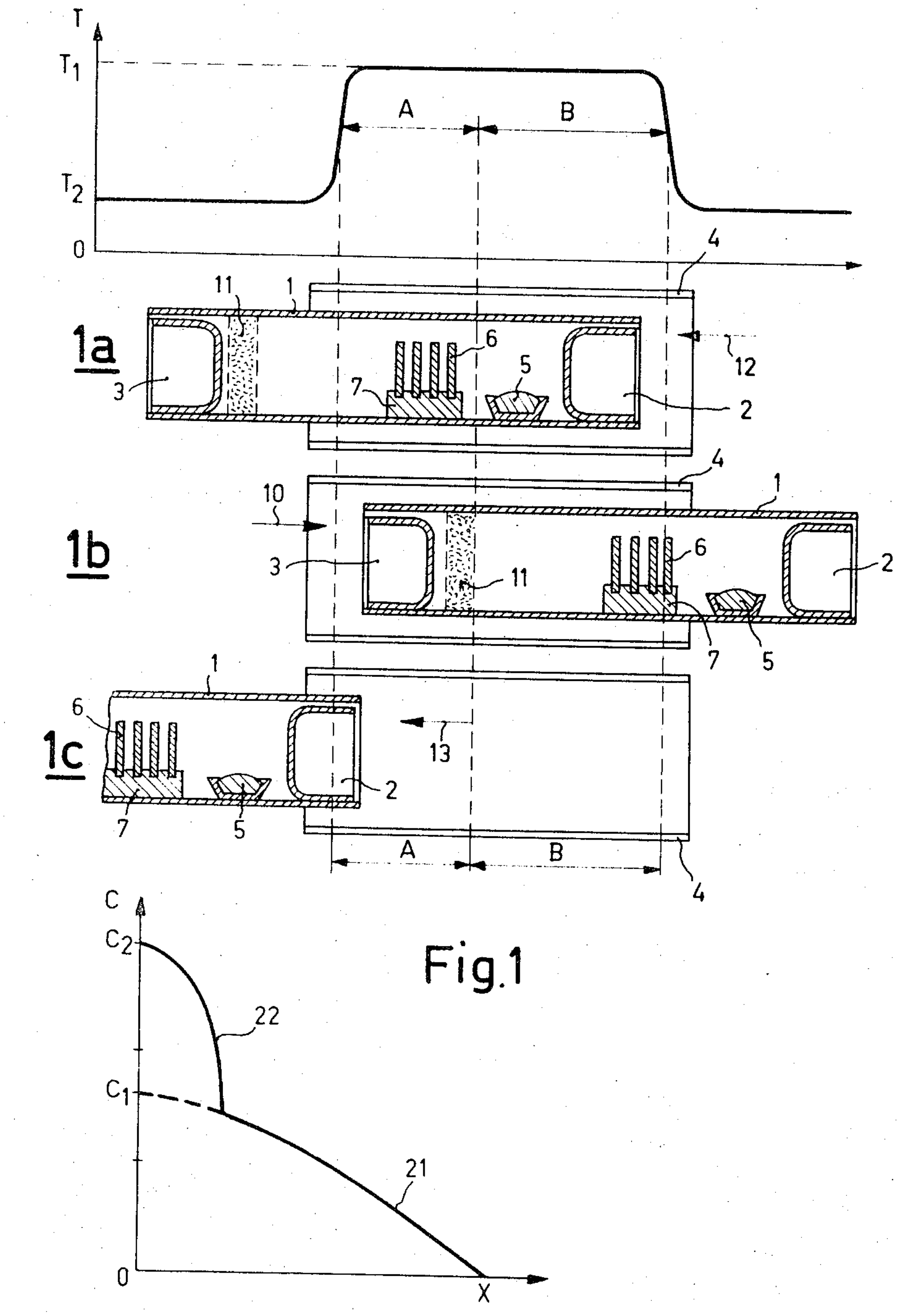

The present invention relates to a method of diffusing a doping material in a semiconductor body in which the doping material is transported to the said body via the vapour phase from a doping source and in which the said source and the body are heated in a space.

For the manufacture of a large number of types of semiconductor devices, diffusion methods are used for the manufacture of junctions or for varying the electric properties of a region in a crystal. A certain concentration gradient of a doping material can be obtained by diffusion simultaneously with a certain surface concentration. In certain cases, for example electroluminescent diodes, the efficiency of the device depends upon the depth of the p-n junction, on the concentration gradient and on the surface concentration of doping materials, which often cannot be simultaneously obtained in an combination optimum by the conventional diffusion methods.

In that case one has to resort to more complicated methods in which the diffusion is carried out in various phases.

In the case in which the diffusion comprises several phases, it has been proposed to temporarily add no doping material to the semiconductor body in which the diffusion is carried out and to heat the semiconductor body during that period in which the concentration gradient varies. The necessity of the interruption of the supply of doping material is caused by the fact that the various diffusion phases have to be carried out during a single operation and so as to avoid the drawbacks of repeating elementary operations, such as the cleaning of the space, the bringing to temperature, the cooling, the filling again with air, the etching, and so on.

A method of this type is described in the British Pat. No. 1,086,660 in which, in addition to the source of the doping material in elementary form, a second source is used which consists of a means for the chemical transport of the doping materials from the first source to the semiconductor body. The second source is present in a zone of variable temperature. When the temperature of the second source is low, the condensation of the transport means hinders for the gas diffusion of the doping material and when the temperature of the second source is high, the diffusion of the doping material is achieved due to the presence of evaporated transport means. Drawbacks of the said methods are (a) that the process takes a rather long time in that the whole diffusion process consists of at least three phases, (b) that the choice of the transporting means is restricted because (1) undesired reactions with the semiconductor body may occur and (2) the pressure dependence of the temperature of the transport means must be large, and (c) that proposed mechanical separation means between a transporting means source and a doping source at high temperatures often give rise to disturbances.

Moreover, the method proposed in the said Bristish Patent Specification using SiO as a transporting means cannot be used for the diffusion in bodies which consist of elements of the columns III and V of the periodic table of elements due to the danger of undesired contamination of the semiconductor body with silicon.

A special object of the present invention is to mitigate the above-mentioned drawbacks and to make it possible to obtain in a semiconductor body a desired profile of a doping material by a single diffusion operation which requires a minimum of means and involves a minimum of danger of undesired impurities.

Another object of the invention is to make it possible to obtain a concentration profile of a doping material having at least two noticeably different gradient parts, of which one part corresponds to a surface layer having a high concentration and a large gradient and another corresponds to a deep layer having a low concentration and a small gradient.

According to the invention, the method of diffusing doping material in a semiconductor body in which the doping material is transported to the said body, via the vapour phase from a doping source and in which the doping source and the body are heated in a space, utilizes a space comprising three regions, namely a central region in which the said body is placed and two end regions which are present on either side of the said central region and which are destined for at least two sources of the same doping material but of different composition and that the said space is arranged in a first phase or position so that the said body and a single doping source are present in a zone of high temperature, after which the space is moved relative to the heating means and, in a second phase, the said body and only a second doping source are held in the said zone of high temperature.

So the diffusion is carried out in a single operation which comprises two phases. During each of the said phases the source which is not used is present outside the zone of high temperature and exerts no influence whatsoever. No chemical reaction is necessary to form the doping sources. The temperature outside the warm zone in which the diffusion is carried out is not decisive. The heating means are provided only to determine a regions of high temperature which may comprise two adjoining zones of the said space.

The temperatures of the heated zone during the operation are preferably kept constant; and the desired concentration profile is obtained by the choice of the composition of each of the doping sources and the diffusion duration, a given constant temperature being taken into account. The risks and losses of time as a result of frequent temperature variations are removed.

The two regions present in the heated zone preferably have the same temperature. This condition simplifies the control and equilibrium problems and improves the accuracy and reproducibility of the process.

If it turns out to be necessary to have different temperatures for the two sources so as to obtain the desired partial pressures or if it turns out to be necessary to have different temperatures for the semiconductor body during the two phases of the process so as to obtain the desired diffusion coefficients, it is possible to give the heating zone a corresponding temperature profile. Said profile is preferably not varied in between the two phases of the operation.

The method according to the invention is preferably used in a space of the half-open type. The space in which the semiconductor body and the doping sources are placed communicates with a constantly refreshed atmosphere of a protective gas through a passage of a restricted cross-section and length which enables a gas exchange. It is known that this type of space makes it possible to obtain restricted partial pressures in an atmosphere of a protective gas, in which gas currents which can attack the surface of the semiconductor body are avoided.

In another preferred embodiment of the invention, diffusion is carried out in a space which is traversed by a current of protective gas at a slow rate. For that purpose, the space is provided at each end with a narrow passage which communicates with a protective gas atmosphere. The supply of gas through the space is small so as not to produce the danger of erosion of the surface of the semiconductor body nor to cause turbulences. Between the two processing phases the direction of the flow of the protective gas through the space is reversed, said direction being each time that from the source to the semiconductor body.

The invention may also be carried out in a space which is closed according to conventional methods, for example, by sealing in the case of a quartz glass space.

In an embodiment which makes it possible to obtain simultaneously a high surface concentration and a large depth of the p-n junction with a very small gradient, a first source is used which consists of a compound or a solution of the doping element and a second source which consists of the pure element, another compound or another solution, in which, according to Raoult's law, a partial vapour pressure of the doping material is adjusted. Actually it is known according to said law that the vapour pressure of a dissolved material above a solution is directly proportional to the atomic content of said material in the solvent.

For example, a zinc diffusion in gallium arsenide can readily be carried out starting from a source which consists of pure zinc, but also by a zinc gallium compound or a zinc arsenic compound $ZnAs_2$. If a zinc gallium compound is used as a first source and a zinc arsenic compound as a second source, a first diffusion phase provides a deep diffused zone with a small surface concentration and a small gradient and the second diffusion phase which lasts considerably shorter gives a surface zone with high concentration in which the vapour pressure of the zinc from $ZnAs_2$ is much higher than the vapour pressure of zinc from ZnGa.

According to a special construction of this embodiment the source used during the second phase of the diffusion process consists of condensate of vapours of the doping material which is formed during the first phase.

During the first phase, a part of the vapours of the doping material which originates from the first source diffuses in the semiconductor body which is provided at the desired temperature. Another part of said vapours reaches the region of the space which is present outside the heated zone and condenses. When the space is moved, the condensate is heated at a high temperature and is used as a second doping source in the second phase of the diffusion.

In the preceding example, the zinc diffusion is carried out in gallium arsenide by means of a first source which consists of a zinc gallium compound and a second source which consists of zinc condensed during the first phase.

The invention may be used for the diffusion of various doping materials in bodies which consist of different materials used for the manufacture of semiconductor devices. The invention may be used in particular for the diffusion of doping materials in the composite bodies comprising elements of the columns III and V of the periodic table of elements, especially the compounds of gallium, arsenic and phosphorus and the compounds of gallium, aluminium and arsenic, in which the doping material diffused in said compounds usually is zinc.

The invention will be described in greater detail with reference to the accompanying drawing.

FIG. 1 is a diagrammatic longitudinal sectional view of a device for carrying out the invention in which the part 1*a* in the figure is the device used during the first phase of the diffusion, part 1*b* is the same device during the second phase and the part 1*c* after the diffusion.

FIG. 2 is a diagram showing a concentration profile.

The device shown by way of example is a device of the half-open type. It mainly consists of a diffusion reactor which is formed by a tube 1 which is closed at either end nonhermetically by means of the stoppers 2 and 3. Said stoppers have a diameter which is slightly smaller than the inner diameter of the tube 1 so that a small passage remains at either end of the tube permitting gas exchange between the inner atmosphere of the reactor and the atmosphere around said reactor. The atmosphere around the reactor consists of a protective gas. For that purpose the reactor is placed, for example, inside a tube (not shown in the drawing) through which a certain gas of a high purity circulates, for example, nitrogen or hydrogen.

The reactor is heated by means of a heating element 4 with respect to which it can be moved in the longitudinal direction. The heating element 4 is provided so as to ensure along the axis thereof a temperature profile which comprises a zone of high temperature $T_1$ between two zones of low temperature $T_2$, as is shown in FIG. 1.

A support 7 having plates 6 in which a diffusion can be carried out and a doping source 5 are arranged in the reactor. Said source is a compound which gives a relatively small vapour pressure of the doping element at high temperature.

In a first phase of the diffusion operation the reactor 1 is placed relative to the zone of high temperature in such manner that the source 5 and the plates 6 are present in said zone and that the other end of the reactor is present in a zone of lower temperature. A flow of neutral gas which forms the atmosphere around the reactor is conveyed in the direction of the arrow 12. The vapours of the doping material which originate from the source 5 diffuse in the plates 6 and a part of said vapours, which are taken along by the small flow of gas which passes between the leak of the stopper 2 and the leak of the stopper 3, will condense on a place 11 of the wall of the reactor. A diffusion profile is obtained in the plates 6 as is shown by curve 21 in FIG. 2 and which denotes the concentration $c$ as a function of the depth $x$, where $C_1$ represents the highest doping level achieved at the first phase (FIG. 1*a*) and $C_2$, that at the second phase (FIG. 1*b*).

In a second phase of the diffusion operation the reactor 1 is moved relative to the zone of high temperature in such manner that the source 5 is present outside said zone and that the plates 6 and the condensate at 11 are present in it. The condensate consists of the pure doping material and its evaporation produces a vapour pressure of said element which is considerably higher than that which is produced by evaporation of the source 5 in the first phase of the diffusion operation. The flow of neutral gas during this phase of the operation is conveyed in the direction of the arrow 10. The vapour of the doping material originating from the condensate at 11 diffuses in the plates 6. A diffusion profile as shown by curve 22 in FIG. 2 is obtained in these plates.

After a diffusion time which is shorter than the diffusion time in the first phase, the reactor is again moved so that the plates and the sources are arranged outside the zone of high temperature, in which the direction of the neutral gas is reversed and the gas is conveyed in the direction of the arrow 13 (FIG. 1*c*).

The second source which consists of condensate can be replaced in the above-described process by a source having other characteristic features than the compounds used as the first source. It is also possible to consider two zone parts of different temperatures in the zone of high temperature: for example, a zone part A in which the plates and the second source are successively placed and a zone part B in which the first source and the plates are successively placed. Extra possibilities are obtained if the temperature of the warm zone or of the one or the other part of the warm zone is varied between the first and second phase of the operation.

An example of the method in a device of the above-described type will now be described hereinafter.

Plates of tellurium-doped gallium arsenide are placed in a half-open reactor. A first zinc source which consists of a small mass of a zinc gallium alloy with 10 percent zinc is placed in the same reactor. The temperature of the heating zone is fixed at 830°C and the cold zones are at approximately 200°C. A flow of nitrogen is directed to the reactor. A first diffusion phase of 50 minutes gives a junction depth of 6 microns but a surface concentration of $5 \times 10^{18}$ to $10^{19}$ zinc atoms per $cm^3$. A second diffusion phase is carried out by means of zinc condensate which is formed during the first phase. Said second phase lasts 1 to 5 minutes and gives a surface layer of 1 micron thickness with a surface concentration in the order of $10^{20}$ atoms per $cm^3$; and thus shows a resistance which is favourable, for example, for providing contact electrodes.

What is claimed is:

1. A method of diffusing doping material in a semiconductor body in which the doping material is transported to the said body via the vapour phase from a doping source and in which the said source and the body are heated in a space, characterized in that the said space comprises three regions, namely a central region in which the said body is placed and two end regions which are present on either side of the said central region and which are destined for at least two sources of the same doping material but of different composition and that the said space in a first phase is arranged so that the said body and a single doping source are present in a zone of high temperature, after which the space is moved relative to the heating means and, in a second phase, the said body and only a second doping source are held in the said zone of high temperature.

2. A method of carrying out diffusions as claimed in claim 1, characterized in that the temperatures of the said zone of high temperature are kept constant during the diffusion operation.

3. A method of carrying out diffusions as claimed in claim 1, wherein two regions of the said space which are present in the zone of high temperature have the same temperatures.

4. A method of carrying out diffusions as claimed in claim 1, wherein the source used during the second phase consists of condensate of vapours of the doping material which is formed during the first phase.

5. A method of carrying out diffusions as claimed in claim 1, wherein at least the first source consists of a compound of a doping element.

6. A method of carrying out diffusions as claimed in claim 1, wherein the diffusion is carried out in a space of the half-open type in which a gas exchange takes place between the space and a constantly refreshed atmosphere of a protective gas via a passage the cross-section of which is smaller than the length.

7. A method of carrying out diffusions as claimed in claim 1, wherein the diffusion is carried out in a first space which is traversed at a low rate by a flow of protective gas, the direction of the gas through the space being reversed between the two operation phases so that each time it is in the direction extending from the source to the body.

8. A method of carrying out diffusions as claimed in claim 1 wherein the diffusion is carried out in a sealed space.

9. A method of carrying out diffusions as claimed in claim 1, wherein the first source consists of a gallium zinc compound and the second source consists of a zinc arsenic compound.

* * * * *